US010001947B1

(12) United States Patent
Chatterjee et al.

(10) Patent No.: US 10,001,947 B1
(45) Date of Patent: Jun. 19, 2018

(54) SYSTEMS, METHODS AND DEVICES FOR PERFORMING EFFICIENT PATROL READ OPERATIONS IN A STORAGE SYSTEM

(71) Applicant: American Megatrends, Inc., Norcross, GA (US)

(72) Inventors: Paresh Chatterjee, Fremont, CA (US); Loganathan Ranganathan, Duluth, GA (US); Venugopalreddy Mallavaram, Duluth, GA (US); Sankarji Gopalakrishnan, Fremont, CA (US)

(73) Assignee: American Megatrends, Inc., Norcross, GA (US)

( * ) Notice: Subject to any disclaimer, the term of this patent is extended or adjusted under 35 U.S.C. 154(b) by 0 days. days.

(21) Appl. No.: 15/143,851

(22) Filed: May 2, 2016

Related U.S. Application Data

(60) Provisional application No. 62/158,622, filed on May 8, 2015.

(51) Int. Cl.
*G06F 3/06* (2006.01)
*G06F 11/10* (2006.01)
*G11C 29/52* (2006.01)

(52) U.S. Cl.
CPC .......... *G06F 3/0653* (2013.01); *G06F 3/0619* (2013.01); *G06F 3/0689* (2013.01); *G06F 11/1076* (2013.01); *G11C 29/52* (2013.01)

(58) Field of Classification Search
CPC .. G06F 3/0653; G06F 3/0619; G06F 11/1076; G11C 29/52
See application file for complete search history.

(56) References Cited

U.S. PATENT DOCUMENTS

| 5,412,612 | A  | * | 5/1995 | Oyama  | G06F 3/0601 365/228 |
| 5,729,511 | A  | * | 3/1998 | Schell | G11B 5/5526 369/116 |
| 6,571,351 | B1 | * | 5/2003 | Mitaru | G06F 11/1076 711/163 |
| 6,742,138 | B1 | * | 5/2004 | Gagne  | G06F 11/1471 714/6.31 |
| 7,246,269 | B1 | * | 7/2007 | Hamilton | G06F 11/106 714/42 |

(Continued)

*Primary Examiner* — Joseph D Torres
(74) *Attorney, Agent, or Firm* — Meunier Carlin & Curfman LLC (57) ABSTRACT

An example computer-implemented method for performing efficient patrol read operations in a storage system including a plurality of disks organized in a RAID array can include determining an I/O load on the storage system, identifying at least one portion of an available storage capacity containing valid data and reading the portion of the available storage capacity containing the valid data. Optionally, the portion of the available storage capacity containing the valid data is the only portion read during the patrol read operations. The method can also include determining whether a medium error exists in the portion of the available storage capacity containing the valid data. If a medium error exists, the method can include fixing the medium error. Additionally, the above operations can optionally be performed only when the I/O load on the storage system is less than a predetermined threshold.

20 Claims, 5 Drawing Sheets

(56) References Cited

U.S. PATENT DOCUMENTS

| | | | | |
|---|---|---|---|---|
| 7,310,743 B1* | 12/2007 | Gagne | G06F 11/2082 | 714/6.31 |
| 7,711,711 B1* | 5/2010 | Linnell | G06F 3/0604 | 707/652 |
| 8,838,793 B1* | 9/2014 | Thrasher | H04L 63/10 | 709/223 |
| 2002/0007469 A1* | 1/2002 | Taketa | G06F 11/1076 | 714/5.11 |
| 2002/0178275 A1* | 11/2002 | Hein | G06F 19/3418 | 709/231 |
| 2005/0102552 A1* | 5/2005 | Horn | G06F 11/1092 | 714/6.22 |
| 2005/0240804 A1* | 10/2005 | Schnapp | G06F 3/0614 | 714/5.1 |
| 2006/0069947 A1* | 3/2006 | Takahashi | G06F 11/1076 | 714/5.11 |
| 2006/0236208 A1* | 10/2006 | Suzuki | G06F 11/1044 | 714/768 |
| 2008/0256226 A1* | 10/2008 | Oya | G05B 19/4184 | 709/223 |
| 2010/0262766 A1* | 10/2010 | Sprinkle | G06F 12/0246 | 711/103 |
| 2013/0173972 A1* | 7/2013 | Kubo | G11C 16/00 | 714/718 |
| 2015/0220394 A1* | 8/2015 | Tanaka | G06F 11/1048 | 714/764 |
| 2015/0331625 A1* | 11/2015 | Nishikubo | G06F 3/06 | 711/103 |
| 2016/0268006 A1* | 9/2016 | Tanaka | G11C 29/38 | |
| 2016/0292152 A1* | 10/2016 | Dennis | G06F 17/303 | |
| 2016/0378589 A1* | 12/2016 | Kambayashi | G06F 11/1004 | 714/807 |

* cited by examiner

SYSTEMS, METHODS AND DEVICES FOR PERFORMING EFFICIENT PATROL READ OPERATIONS IN A STORAGE SYSTEM

CROSS-REFERENCE TO RELATED APPLICATIONS

This application claims the benefit of U.S. Provisional Patent Application No. 62/158,622, filed on May 8, 2015, entitled "SYSTEMS, METHODS AND DEVICES FOR PERFORMING EFFICIENT PATROL READ OPERATIONS IN A STORAGE SYSTEM," the disclosure of which is expressly incorporated herein by reference in its entirety.

BACKGROUND

To protect against data loss, a storage system can include a redundant array of inexpensive disks ("RAID"). The RAID level used for a RAID array depends on a number of factors including redundancy level, performance and reliability of the desired array. Standard RAID levels include RAID 1, RAID 4, RAID 5, RAID 6, etc. For example, in RAID 5, data is striped across the plurality of disks in the RAID array. In a four disk array, a RAID stripe includes data chunk $D_1$ stored on disk 1, data chunk $D_2$ stored on disk 2, data chunk $D_3$ stored on disk 3 and parity chunk $P_A$ stored on disk 4. Additionally, the parity chunks in a RAID 5 array are distributed or staggered across the plurality of disks. In the event of disk failure, the chunk contained on the failed disk can be computed based on the chunks contained on the remaining disks of the RAID array. For example, if disk 1 fails, data chunk $D_1$ can be computed based on data chunk $D_2$ stored on disk 2, data chunk $D_3$ stored on disk 3 and parity chunk $P_A$ stored on disk 4.

It is possible that one or more sectors of a disk can experience media errors, i.e., become damaged or un-useable for a period of time. Media errors can be caused by dust or moisture, for example. When a RAID array is in a degraded state (e.g., a disk has failed) and a sector of another disk experiences a medium error, data recovery might not be possible. For example, if the medium error exists in a data chunk (or parity chunk) of a RAID stripe, then a data chunk (or parity chunk) of the RAID stripe contained on the failed disk cannot be recovered because there is not enough information available to compute the missing data chunk. Accordingly, in order to avoid the above problem, patrol reads are performed on an optimal RAID array to identify and fix media errors.

SUMMARY

Systems, methods and devices for performing efficient patrol read operations in a storage system are provided herein. A patrol read application can send commands to the storage system, for example to mass storage devices such as disks of the storage system, to determine whether one or more sectors of the mass storage devices contain media errors. If a medium error is identified, the medium error can be fixed. The patrol read application, however, imposes a performance penalty on the storage system due to the bandwidth required to send commands to the mass storage devices. In order to minimize degradation of performance, patrol read operations can be intelligently performed on portions of an available storage capacity containing valid data. Optionally, patrol reads can be performed only on portions of the available storage capacity containing valid data. This reduces the number of commands sent to the mass storage devices. Alternatively or additionally, patrol read operations can optionally be performed during periods of low I/O load on the storage system. For example, patrol read operations can be performed when I/O load on the storage system is below average.

An example computer-implemented method for performing efficient patrol read operations in a storage system including a plurality of disks organized in a RAID array can include determining an input/output ("I/O") load on the storage system, identifying at least one portion of an available storage capacity of the storage system containing valid data and reading the portion of the available storage capacity of the storage system containing the valid data. Optionally, it is possible to read only the portion of the available storage capacity of the storage system containing the valid data. The method can also include determining whether a medium error exists in the portion of the available storage capacity of the storage system containing the valid data. If a medium error exists, the method can include fixing the medium error. Additionally, the above operations can optionally be performed only when the I/O load on the storage system is less than a predetermined threshold.

Optionally, at least one portion of an available storage capacity of the storage system containing valid data can be identified using mapping information. For example, the mapping information can identify a RAID stripe containing valid data. The valid data can be data written to the RAID stripe. Alternatively or additionally, the mapping information can identify one or more allocated portions of the available storage capacity to which data is written. The valid data can optionally be data written to a portion of the allocated storage capacity. The mapping information can also optionally identify one or more allocated portions of the available storage capacity to which data is not written. Additionally, the mapping information can optionally be a RAID stripe bitmap. The RAID stripe bitmap can identify the allocated portions of the available storage capacity to which data has been not been written such as, for example, RAID stripes containing valid, written data.

Alternatively or additionally, in order to read the portion of the available storage capacity of the storage system containing the valid data, the method can optionally include issuing a READ VERIFY small-computer systems interface ("SCSI") command to the storage system and receiving an acknowledgement to the READ VERIFY SCSI command from the storage system.

Optionally, if the medium error exists in a parity chunk of a RAID stripe, the method can include reading a data chunk of the RAID stripe and writing the parity chunk of the RAID stripe in order to correct the medium error. By reading the data chunk and writing the parity chunk of the RAID stripe, the parity chunk of the RAID stripe is computed as part of the reading/writing process. Optionally, the medium error existing in the parity chunk can be corrected by issuing a LONG WRITE SCSI command.

Alternatively or additionally, if the medium error exists in a data chunk of a RAID stripe, the method can include reading the data chunk of the RAID stripe containing the medium error. Optionally, the medium error existing in the data chunk can be corrected by issuing a READ SCSI command. By reading the data chunk of the RAID stripe containing the medium error, the data chunk of the RAID stripe is computed using the corresponding data and parity chunks of the RAID stripe.

Optionally, the method can further include dynamically controlling a rate or speed of the patrol read operations based on the I/O load on the storage system. Additionally, information lifecycle management ("ILM") statistics for the storage system can optionally be used to determine the I/O load of the storage system.

It should be understood that the above-described subject matter may also be implemented as a computer-controlled apparatus, a computing system, or an article of manufacture, such as a computer-readable storage medium.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. While implementations will be described for performing patrol read operations in a storage system, it will become evident to those skilled in the art that the implementations are not limited thereto.

Figure 1:
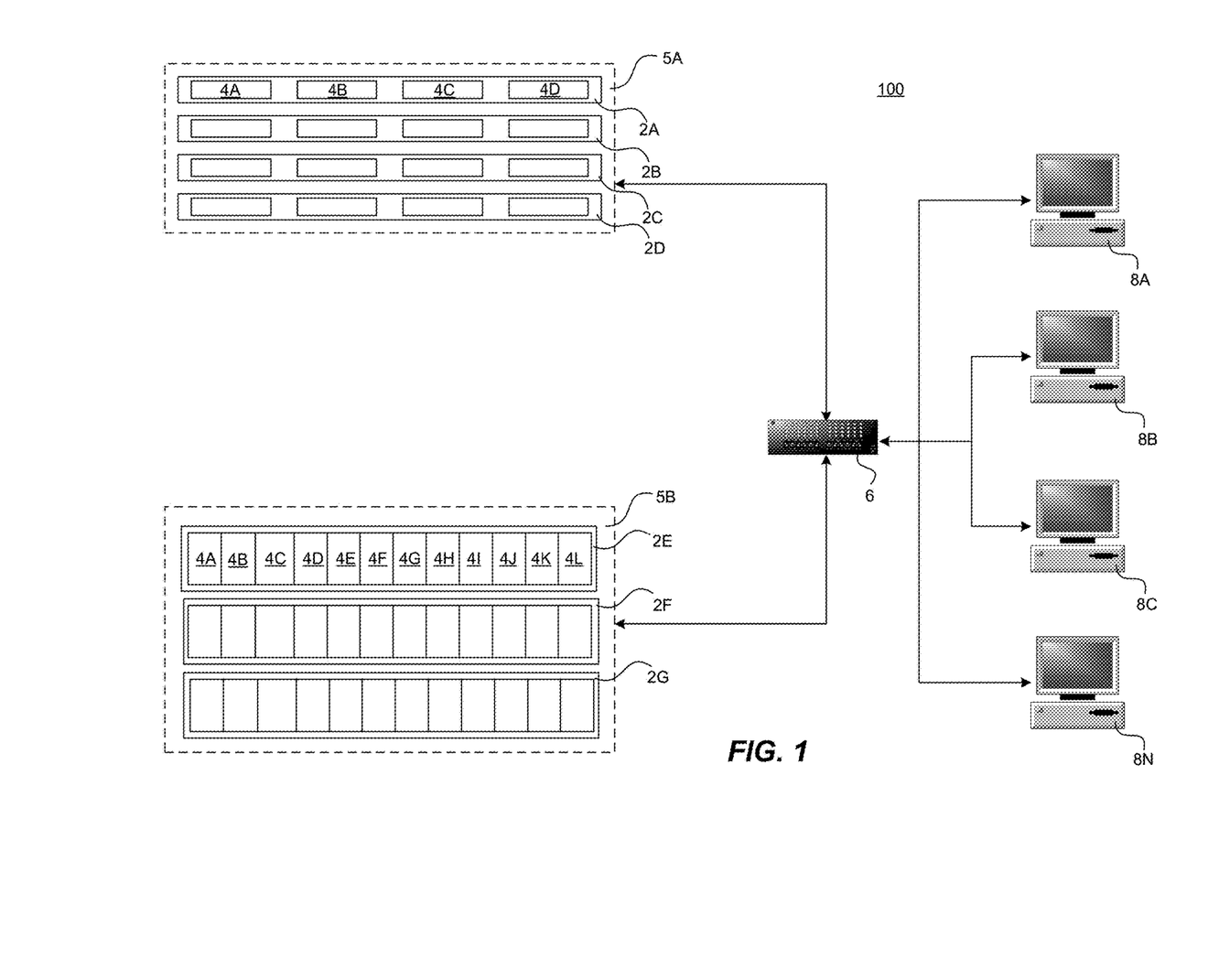
FIG. 1 is a computer architecture and network diagram showing aspects of a computer network and a storage server computer that provides an operating environment for embodiments of the disclosure presented herein.
Figure 2:
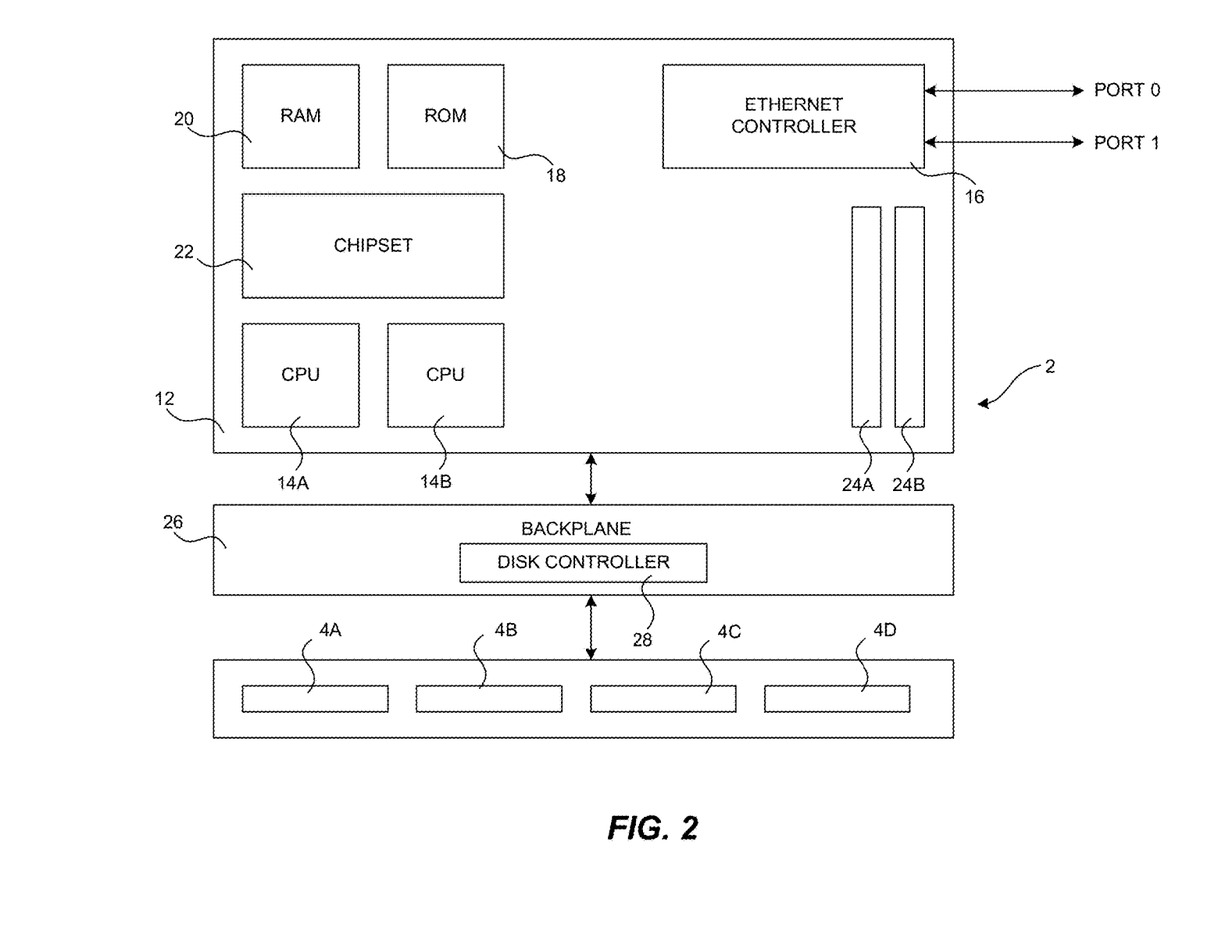
FIG. 2 is a computer architecture diagram illustrating aspects of the hardware of an illustrative storage server computer described herein.
Figure 3:
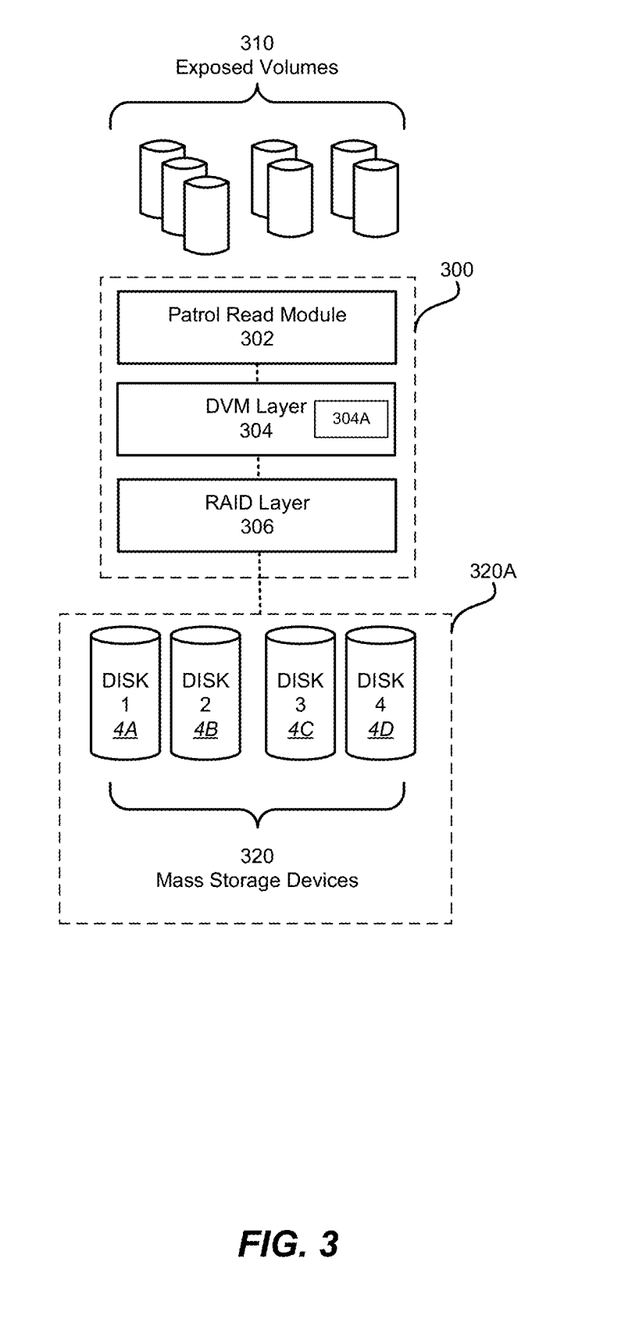
FIG. 3 is a software architecture diagram illustrating various aspects of a storage stack utilized by a storage server computer described herein.

FIGS. 1-3 and the following discussion are intended to provide a brief, general description of a suitable computing environment in which the embodiments described herein may be implemented. Generally, program modules include routines, programs, components, data structures, and other types of structures that perform particular tasks or implement particular abstract data types. Moreover, those skilled in the art will appreciate that the embodiments described herein may be practiced with other computer system configurations, including hand-held devices, multiprocessor systems, microprocessor-based or programmable consumer electronics, minicomputers, mainframe computers, and the like. The embodiments described herein may also be practiced in distributed computing environments where tasks are performed by remote processing devices that are linked through a communications network. In a distributed computing environment, program modules may be located in both local and remote memory storage devices. While the implementations presented herein will be described in the general context of program modules that execute in conjunction with an operating system on a computer system, those skilled in the art will recognize that they may also be implemented in combination with other program modules.

Turning now to FIG. 1, details will be provided regarding an illustrative operating environment for the implementations presented herein, as well as aspects of software components that provide the functionality described herein for performing efficient patrol read operations in a storage system. In particular, FIG. 1 is a network architecture diagram showing aspects of a storage system 100 that includes several virtualized clusters 5A-5B. A virtualized cluster is a cluster of different storage nodes that together expose a single storage device. In the example storage system 100 shown in FIG. 1, the clusters 5A-5B (collectively, clusters 5) include storage server computers 2A-2G (also referred to herein as "storage nodes" or a "node", collectively nodes 2) that are operative to read and write data to one or more mass storage devices, such as hard disk drives. The cluster 5A includes the nodes 2A-2D and the cluster 5B includes the nodes 2E-2G. All of the nodes 2 in a cluster 5 can be physically housed in the same rack, located in the same building, or distributed over geographically diverse locations, such as various buildings, cities, or countries.

According to implementations, the nodes within a cluster may be housed in a one rack space unit storing up to four hard disk drives. For instance, the node 2A is a one rack space computing system that includes four hard disk drives 4A-4D (collectively, disks 4). Alternatively, each node may be housed in a three rack space unit storing up to fifteen hard disk drives. For instance, the node 2E includes hard disk drives 4A-4L. Other types of enclosures may also be utilized that occupy more or fewer rack units and that store fewer or more hard disk drives. In this regard, it should be appreciated that the type of storage enclosure and number of hard disk drives utilized is not generally significant to the implementation of the embodiments described herein. Any type of storage enclosure and virtually any number of hard disk devices or other types of mass storage devices may be utilized.

As shown in FIG. 1, multiple storage nodes may be configured together as a virtualized storage cluster. For instance, the nodes 2A-2D have been configured as a storage cluster 5A and the nodes 2E-2G have been configured as a storage cluster 5B. In this configuration, each of the storage nodes 2A-2G is utilized to handle I/O operations independently, but are exposed to the initiator of the I/O operation as a single device. It should be appreciated that a storage cluster may include any number of storage nodes. A virtualized cluster in which each node contains an independent processing unit, and in which each node can field I/Os independently (and route them according to the cluster layout) is called a horizontally virtualized or peer cluster. A cluster in which each node provides storage, but the processing and mapping is done completely or primarily in a single node, is called a vertically virtualized cluster.

Data may be striped across the nodes of each storage cluster. For instance, the cluster 5A may stripe data across the storage nodes 2A, 2B, 2C and 2D. The cluster 5B may similarly stripe data across the storage nodes 2E, 2F and 2G. Striping data across nodes generally ensures that different I/O operations are fielded by different nodes, thereby utilizing all of the nodes simultaneously, and that the same I/O operation is not split between multiple nodes. Striping the data in this manner provides a boost to random I/O performance without decreasing sequential I/O performance.

According to embodiments, each storage server computer 2A-2G includes one or more network ports operatively connected to a network switch 6 using appropriate network cabling. It should be appreciated that, according to embodiments of the invention, Ethernet or Gigabit Ethernet may be utilized. However, it should also be appreciated that other types of suitable physical connections may be utilized to form a network of which each storage server computer 2A-2G is a part. Through the use of the network ports and other appropriate network cabling and equipment, each node within a cluster is communicatively connected to the other nodes within the cluster. Many different types and number of connections may be made between the nodes of each cluster. Furthermore, each of the storage server computers 2A-2G need not be connected to the same switch 6. The storage server computers 2A-2G can be interconnected by any type of network or communication links, such as a LAN, a WAN, a MAN, a fiber ring, a fiber star, wireless, optical, satellite, or any other network technology, topology, protocol, or combination thereof.

Each cluster 5A-5B is also connected to a network switch 6. The network switch 6 is connected to one or more client computers 8A-8N (also referred to herein as "initiators"). It should be appreciated that other types of networking topologies may be utilized to interconnect the clients and the clusters 5A-5B. It should also be appreciated that the initiators 8A-8N may be connected to the same local area network (LAN) as the clusters 5A-5B or may be connected to the clusters 5A-5B via a distributed wide area network, such as the Internet. An appropriate protocol, such as the Internet Small Computer Systems Interface ("iSCSI") or Fiber Channel protocol may be utilized to enable the initiators 8A-8N to communicate with and utilize the various functions of the storage clusters 5A-5B over a wide area network such as the Internet. An appropriate protocol, such as iSCSI, Fiber Channel, or Serial Attached SCSI ("SAS"), is also used to enable the members of the storage cluster to communicate with each other. These two protocols need not be similar.

Examples of the disks 4 may include hard drives, spinning disks, stationary media, non-volatile memories, or optically scanned media; each, or in combination, employing magnetic, capacitive, optical, semiconductor, electrical, quantum, dynamic, static, or any other data storage technology. The disks 4 may use IDE, ATA, SATA, PATA, SCSI, USB, PCI, Firewire, or any other bus, link, connection, protocol, network, controller, or combination thereof for I/O transfers.

Referring now to FIG. 2, an illustrative computer hardware architecture for practicing various embodiments will now be described. In particular, FIG. 2 shows an illustrative computer architecture and implementation for each storage node 2. In particular, each storage server computer 2 includes a baseboard 12, or "motherboard," which is a printed circuit board to which a multitude of components or devices may be connected by way of a system bus or other electrical communication path. In one illustrative embodiment, these components include, without limitation, one or more central processing units ("CPUs") 14A-14B, a network adapter, such as the Ethernet controller 16, a system memory, including a Read Only Memory 18 ("ROM") and a Random Access Memory 20 ("RAM"), and other hardware for performing input and output, such as a video display adapter or a universal serial bus port ("USB"), not all of which are illustrated in FIG. 2.

The motherboard 12 may also utilize a system board chipset 22 implementing one or more of the devices described herein. One or more hardware slots 24A-24B may also be provided for expandability, including the addition of a hardware RAID controller to the storage server computer 2. It should also be appreciate that, although not illustrated in FIG. 2, a RAID controller may also be embedded on the motherboard 12 or implemented in software by the storage server computer 2. It is also contemplated that the storage server computer 2 may include other components that are not explicitly shown in FIG. 2 or may include fewer components than illustrated in FIG. 2.

As described briefly above, the motherboard 12 utilizes a system bus to interconnect the various hardware components. The system bus utilized by the storage server computer 2 provides a two-way communication path for all components connected to it. The component that initiates a communication is referred to as a "master" component and the component to which the initial communication is sent is referred to as a "slave" component. A master component therefore issues an initial command to or requests information from a slave component. Each slave component is addressed, and thus communicatively accessible to the master component, using a particular slave address. Both master components and slave components are operable to transmit and receive communications over the system bus. Buses and the associated functionality of master-slave communications are well-known to those skilled in the art, and therefore not discussed in further detail herein.

As discussed briefly above, the system memory in the storage server computer 2 may include including a RAM 20 and a ROM 18. The ROM 18 may store a basic input/output system ("BIOS") or Extensible Firmware Interface ("EFI") compatible firmware that includes program code containing the basic routines that help to transfer information between elements within the storage server computer 2. As also described briefly above, the Ethernet controller 16 may be capable of connecting the local storage server computer 2 to the initiators 8A-8N via a network. Connections which may be made by the network adapter may include LAN or WAN connections. LAN and WAN networking environments are commonplace in offices, enterprise-wide computer networks, intranets, and the Internet. The CPUs 14A-14B utilized by the storage server computer 2 are standard central processing units that perform the arithmetic and logical operations necessary for the operation of the storage server computer 2. CPUs are well-known in the art, and therefore not described in further detail herein. A graphics adapter may or may not be utilized within the storage server computer 2 that enables the display of video data (i.e., text and/or graphics) on a display unit.

As shown in FIG. 2, the motherboard 12 is connected via a backplane 26 and disk controller 28 to one or more mass storage devices. The mass storage devices may comprise hard disk drives 4A-4D or other types of high capacity high speed storage. The disk controller 28 may interface with the hard disk drives 4A-4D through a serial advanced technology attachment ("SATA") interface, a small computer system interface ("SCSI"), a fiber channel ("FC") interface, a SAS interface, or other standard interface for physically connecting and transferring data between computers and physical storage devices. The mass storage devices may store an operating system suitable for controlling the operation of the storage server computer 2, such as the LINUX operating system. The hard disk drives may also store application programs and virtually any other type of data. It should be appreciated that the operating system comprises a set of programs that control operations of the storage server computer 2 and allocation of resources. The set of programs, inclusive of certain utility programs, may also provide a graphical user interface to a user. An application program is software that runs on top of the operating system software and uses computer resources made available through the operating system to perform application specific tasks desired by the user.

The mass storage devices and their associated computer-readable media, provide non-volatile storage for the storage server computer 2. Although the description of computer-readable media contained herein refers to a mass storage device, such as a hard disk or CD-ROM drive, it should be appreciated by those skilled in the art that computer-readable media can be any available media that can be accessed by the local storage server. By way of example, and not limitation, computer-readable media may comprise computer storage media and communication media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer.

Referring now to FIG. 3, an example computer software architecture for practicing the various embodiments presented herein will now be described. The computer software architecture can be implemented in a storage node 2 shown in FIGS. 1 and 2, for example. In particular, FIG. 3 illustrates a storage stack 300 used in the embodiments described herein. The storage stack 300 can include a patrol read module 302, a distributed volume management ("DVM") layer 304 and a RAID layer 306. At the top of the storage stack 300, storage volumes 310 are exposed, for example, to the initiators 8A-8N shown in FIG. 1. At the bottom of the storage stack 300 are the mass storage devices 320, such as the disks 4A-4D, that are used to store the data. As discussed above, the mass storage devices are connected to a disk controller such as the disk controller 28 shown in FIG. 2. The disk controller interfaces with the mass storage devices using any standard interface such as SATA, SCSI, FC, SAS interface, etc. for physically connecting and transferring data between computers and the mass storage devices.

The mass storage devices 320 can be organized into a RAID array 320A. The RAID level used for the RAID array 320A can depend on a number of factors, such as the redundancy level, performance requirements and reliability of the desired array. For example, the mass storage devices 320 can organized into a RAID 5 array, e.g., block-level striping across the RAID array 320A with parity data distributed across all members of the RAID array 320A. It will be appreciated, however, that the embodiments described herein may be used with storage nodes 2 connected to a RAID array 320A organized with other standard RAID levels where redundant information is included in the storage of the array, including RAID 1, RAID 4 and RAID 6, as well as hybrid levels such as RAID 50 or RAID 60.

The RAID array 320A is accessed through the RAID layer 306. The RAID layer 306 abstracts the organization of the RAID array 320A and presents a logical block-level interface to higher layers (e.g., the DVM layer 304) in the storage stack 300. The RAID layer 306 can be implemented on the storage node 2 in software, hardware, or a combination thereof. For example, the RAID layer 306 can be provided by the MD kernel extension provided by the LINUX operating system. Alternatively or additionally, the RAID layer 306 can be provided by a STORTRENDS® storage solution from AMERICAN MEGATRENDS, INC. of NORCROSS, GEORGIA, installed in the storage node 2. Additionally, the RAID layer 306 can optionally be implemented by software and/or hardware components from a variety of vendors beyond those described herein.

The DVM layer 304 uses the block-level interface provided by the RAID layer 306 to manage the available storage capacity of the RAID array 320A and service I/O operations initiated by the initiators 8A-8N. The DVM layer 304 can implement a variety of storage management functions, such as volume virtualization, thin provisioning, snapshots, locking, data replication, etc. The DVM layer 304 can be implemented on the storage node 2 in software, hardware or a combination thereof. Volume virtualization provides the facility to create and manage multiple, logical volumes on the RAID array 320A, as well as expand a logical volume across multiple storage nodes within a storage cluster. Thin provisioning provides for the allocation of physical capacity of the RAID array 320A to logical volumes on an as-needed basis. For example, the available physical storage capacity of the RAID array 320A can be divided into a number of unique, equally-sized areas referred to as territories and further subdivide into unique, equally-sized areas referred to as provisions. A territory can optionally be an 8 MB portion of the available storage capacity and a provision can optionally be a 512 KB portion of the available storage capacity, for example. Alternatively, it should be understood that a territory and a provision can optionally have a size more or less than 8 MB and 512 KB, respectively. The available physical storage capacity can be provisioned on an as-needed basis, for example, as new writes are received. Snapshots provide functionality for creating and utilizing point-in-time snapshots of the contents of logical storage volumes. The locking functionality allows for synchronizing I/O operations within the storage node 2 or across nodes within the storage cluster. Data replication provides functionality for replication of data within the storage node 2 or across nodes within the storage cluster 2.

The DVM layer 304 can also include a provision tracking module 304A that maintains mapping information for provisions allocated from the RAID array 320A. As discussed above, the RAID layer 306 abstracts the organization of the RAID array 320A and presents a logical block-level interface to the DVM layer 304. The DVM layer 304 allocates provisions from the RAID array 320A. In accordance with the RAID level, the provisions are distributed across the RAID array 320 (e.g, the mass storage devices 320 of the RAID array 320A) in one or more RAID stripes. Each RAID stripe includes data and parity chunks distributed and stored by the mass storage devices 320 of the RAID array 320A. The provision tracking module 304 can convert the allocated provisions into one or more RAID stripes using the RAID level and configuration of the mass storage devices 320, for example. Thus, the provision tracking module 304A can maintain mapping information for provisions allocated from the RAID array 320A. Optionally, the provision tracking module 304A can also maintain mapping information for portions of the allocated provision to which data is written. For example, the provision tracking module 304A can maintain mapping information for the RAID stripes having valid data, e.g., the RAID stripes to which data is written. In other words, the DVM layer 304 has information about which logical block addresses ("LBAs") of the RAID array 320A are allocated and/or which LBAs of the RAID array 320A are used (e.g., contain written data). As described below, this information can be used by the patrol read module 302 to identify specific physical sector ranges on which to perform patrol read operations (e.g., those containing valid data). Optionally, this mapping information can be maintained as a RAID stripe bitmap. The RAID stripe bitmap can include information regarding the RAID stripes of the RAID array 320A. For example, a value of 1 (or alternatively 0) can identify the RAID stripes (e.g., portions of each disk in the RAID array corresponding to the RAID stripes) having valid data, and a value of 0 (or alternatively 1) can identify RAID stripes not having valid data. The RAID stripes having valid data can be RAID stripes storing data that is written to the RAID array 320A, for example.

The patrol read module 302 verifies that there are no media errors in the mass storage devices 320. The patrol read module 302 can be implemented on the storage node 2 in software, hardware or a combination thereof. A medium error can exist in a sector of any one of the mass storage devices 320 (e.g., disks 4A-4D), for example. A medium error can be caused by dust, moisture, etc. The patrol read module 302 sends commands to each of the mass storage devices 320 to determine whether there is a medium error in any sector of any of the mass storage devices 320. The patrol read module 302 can optionally send messages periodically, for example, during times of low load on the storage system. For example, the patrol read module 302 can periodically check with the RAID layer 306 to determine I/O load, and based on the I/O load, the patrol read module 302 can perform patrol read operations (e.g., during periods of low load) or go to sleep (e.g., during periods of high load). Alternatively or additionally, the patrol read module 302 can be configured to not perform patrol read operations during RAID initialization, RAID background initialization, RAID rebuild, and/or periods when the RAID array 320A is degraded. Alternatively or additionally, the patrol read module 302 operates as a background process.

The patrol read module 302 can identify one or more portions of the available storage capacity of the storage system having valid data. For example, the patrol read module 302 can query the DVM module 304 and request the allocated provisions containing valid data. As discussed above, the provision tracking module 304A maintains mapping information for the allocated provisions. For example, the provision tracking module 304A can covert provisional allocated from the RAID array 320A into one or more RAID stripes based on the RAID level and configuration of the RAID array 320A. This information can optionally be maintained in a RAID stripe bitmap, for example. The provision tracking module 304A can therefore return the portions of the available storage capacity of the storage system having valid data (e.g., the RAID stripe bitmap) to the patrol read module 302 in response to the query. Optionally, the RAID stripe bitmap can be preserved by the file system or operating system partition to maintain a watermark across reboot. Optionally, the RAID stripe bitmap can be preserved at predetermined intervals. Using the watermark, patrol read operations can be resumed from the last completed RAID stripe to prevent recursive patrol read operations.

The patrol read module 302 can send commands to the mass storage devices 320, for example, to read the portions of the available storage capacity of the storage system having valid data. In other words, the patrol read module 302 can send read commands directed to sectors of the mass storage devices 320 having valid data. These portions can be identified, for example, by querying the DVM module 304 as discussed above. Optionally, the patrol read module 302 can send a READ VERIFY SCSI command to the mass storage devices 320 to find media errors. Additionally, the mass storage devices 320 can perform and acknowledge the READ VERIFY SCSI command. Optionally, the patrol read module 302 can only request to read the portions of the available storage capacity of the storage system having valid data. Patrol read operations impose a performance penalty on the storage system. By performing patrol read operations on the portions of the available storage capacity of the storage system having valid data (e.g., sectors having valid data) as opposed to the entire available storage capacity (e.g., all sectors), it is possible to minimize degradation in performance caused by patrol read operations. Additionally, identifying media errors in portions of the available storage capacity not having valid data (e.g., sectors not having valid data) does not improve the reliability of the RAID array 320A. For example, the RAID layer 306 would not be capable of returning consistency to portions of the RAID array 320A to which data has not yet been written because parity information is not computed until data is written.

The patrol read module 302 can determine whether a medium error exists in the portions of the available storage capacity of the storage system having valid data based on the responses to the commands sent to the mass storage devices 320. For example, the patrol read module 302 can determine whether a medium error exists in a RAID stripe. Optionally, if a medium error exists in a particular RAID stripe, the patrol read module 302 can perform sector-level patrol read operations on the particular RAID stripe. It should be understood that this increases the speed and efficiency of patrol read operations.

If the patrol read module 302 identifies a medium error, the patrol read module 302 can fix the medium error. For example, the patrol read module 302 can issue I/O commands via the RAID layer 306 to fix the medium error. There are two possible scenarios. First, a medium error can exist in a parity chunk of a RAID stripe. If so, the patrol read module 302 can read any data chunk in the RAID stripe containing the parity chunk with the medium error and then write the read data chunk in the RAID stripe. The parity chunk can be computed and written to the RAID stripe. Alternatively or additionally, a medium error can exist in a data chunk of a RAID stripe. If so, the patrol read module 302 can read the data chunk with the medium error in the RAID stripe. The remaining data chunks and parity chunk can be read, and the data chunk with the medium error can be computed therefrom. Optionally, a LONG WRITE SCSI command can be used to fix the medium error. Using the LONG WRITE COMMAND, the data or parity chunk with the medium error is regenerated (e.g., computed) from the existing chunks in the RAID stripe (i.e., the chunks not containing media errors). Optionally, a READ SCSI command can be used to fix the medium error in the data chunk of the RAID stripe. By reading the data chunk of the RAID stripe containing the medium error, the data chunk of the RAID stripe is regenerated (e.g., computed) using the corresponding data and parity chunks in the RAID stripe (i.e., the chunks not containing media errors).

A number of additional layers can optionally be provided by the storage stack 300 above the DVM layer 304, for example, depending upon the access mechanism used by the initiators 8A-8N to access the data stored in the RAID array 320A. For example, a storage area network ("SAN") path can be provided that uses a cache module and iSCSI driver. Alternatively or additionally, a network attached storage ("NAS") path can be provided that uses a LINUX cache and the XFS high-performance journaling file system. The storage node 2 exposes logical storage volumes through a block-level interface via the SAN path, while fileshares are exposed through a file-level interface via the NAS path.

Figure 4:
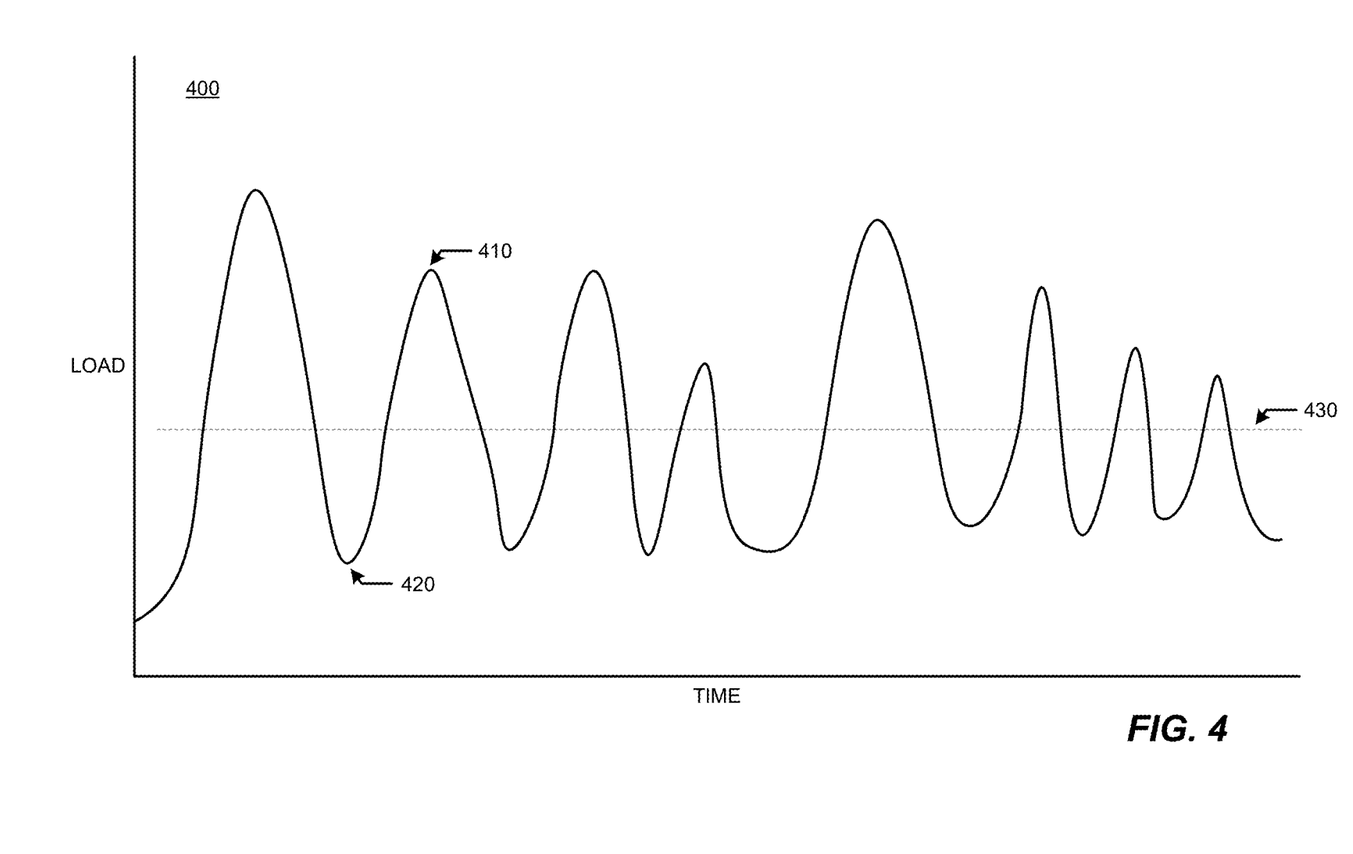
FIG. 4 is a system load plot illustrates storage system I/O load over time according to an embodiment presented herein.

Optionally, patrol read operations can be performed during times when I/O load on the storage system is less than a predetermined threshold. For example, patrol read operations can optionally be performed when I/O load on the storage system is below the average I/O load. In other words, the predetermined threshold can be the average I/O load on the storage system. Alternatively, this disclosure contemplates that the predetermined threshold can have other values or be more or less than the average I/O load on the storage system. Optionally, the patrol read module 304A can check with the RAID layer 306 to obtain I/O load. Alternatively or additionally, the patrol read module 304 can optionally check with an information lifecycle management (ILM) to obtain I/O load, which can be implemented on the storage node 2 in software, hardware or a combination thereof. Alternatively or additionally, the rate or speed of patrol read operations can be determined dynamically based on I/O load. It should be understood that the predetermined threshold can optionally be more or less than average I/O load. Referring now to FIG. 4, a system load plot 400 illustrates storage system I/O load over time according to an embodiment presented herein. As described above, the RAID module 306 or the ILM module can inform patrol read operations, which reduces undesirable impact on storage system performance and increases efficiency of patrol read operations. Optionally, the provision tracking module discussed above with regard to FIG. 3 can request or obtain information regarding the I/O load on the storage system. As discussed above, patrol read operations impose a performance penalty on or otherwise impact resources within the storage system. Thus, performing patrol read operations at times when I/O load on the storage system is less than a predetermined threshold can reduce, or alleviate, impact on production I/O operations of the storage system due to resource consumption by patrol read operations. For example, considering the system load plot 400, performing patrol read operations at times when I/O load is less than the average I/O load 430 (e.g., point 420) can be preferable to performing patrol read operations at times when I/O load is greater than the average I/O load 430 (e.g., point 410).

Figure 5:
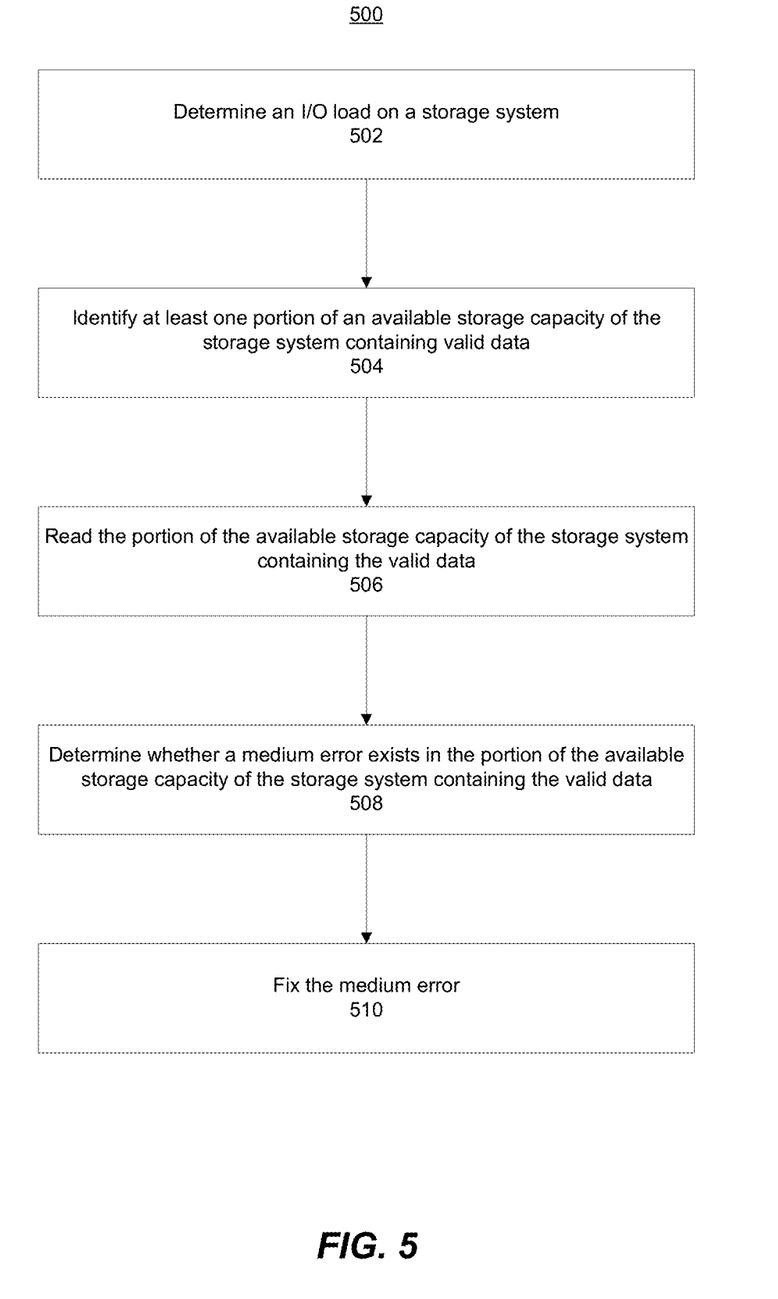
FIG. 5 is a flow diagram illustrating example operations for performing efficient patrol read operations in a storage system.

Referring now to FIG. 5, a flow diagram illustrating example operations 500 for performing efficient patrol read operations in a storage system is shown. It should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in parallel, or in a different order than those described herein.

At 502, an I/O load on the storage system is determined. As described above, patrol read operations can be informed based on I/O load tracked by the RAID layer and/or an ILM module. At 504, at least one portion of an available storage capacity of the storage system containing valid data is identified. The available storage capacity can be made of a plurality of mass storage device (e.g., disks) organized in a RAID array as discussed in detail above. When data is stored in a RAID array, the data, including parity information, is distributed across the mass storage devices. As discussed above, mapping information corresponding to the valid data, e.g., RAID stripes containing valid data, can be maintained. The mapping information can then be used to inform patrol read operations. When the I/O load on the storage system is less than a predetermined threshold, e.g., an average I/O load on the storage system, the operations can proceed to steps 506-510 discussed below. In other words, patrol read operations may not be performed when the I/O load on the storage system is greater than a predetermined threshold. Alternatively or additionally, patrol read operations may not be performed during RAID initialization, RAID background initialization, RAID rebuild, and/or periods when the RAID array is degraded. At 506, the portion of the available storage capacity of the storage system containing the valid data can be read. For example, one or more RAID stripes containing valid data can optionally be read. Optionally, it is possible to read only the RAID stripes containing valid data. At 508, a determination can be made as to whether a medium error exists in the portion of the available storage capacity of the storage system containing the valid data. Then, at 510, if a medium error exists, the medium error is fixed. For example, if the medium error exists in a parity chunk of a RAID stripe, the operations can include reading and writing a corresponding data chunk of the RAID stripe in order to correct the medium error. By reading and writing a data chunk, the parity chunk of the RAID stripe is computed as part of the reading/writing process. Optionally, the medium error existing in the parity chunk of the RAID stripe can be corrected by issuing a LONG WRITE SCSI command. Alternatively or additionally, if the medium error exists in a data chunk of a RAID stripe, the operations can include reading the data chunk containing the medium error. Optionally, the medium error existing in the data chunk of the RAID stripe can be corrected by issuing a READ SCSI command or a LONG WRITE SCSI command. By reading the data chunk of the RAID stripe containing the medium error, the data chunk of the RAID stripe is computed based on the corresponding data and parity chunks of the RAID stripe.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A computer-implemented method for performing efficient patrol read operations in a storage system including a plurality of disks organized in a RAID array, the method comprising:
   determining an input/output ("I/O") load on the storage system;
   identifying at least one portion of an available storage capacity of the storage system containing valid data by querying a distributed volume management layer to request one or more allocated provisions containing valid data;

reading the portion of the available storage capacity of the storage system containing the valid data;
determining whether a medium error exists in the portion of the available storage capacity of the storage system containing the valid data; and
if a medium error exists, fixing the medium error, wherein reading the portion of the available storage capacity of the storage system containing the valid data, determining whether a medium error exists in the portion of the available storage capacity of the storage system containing the valid data and fixing the medium error are performed only when the I/O load on the storage system is less than a predetermined threshold.

2. The computer-implemented method of claim 1, wherein identifying at least one portion of an available storage capacity of the storage system containing valid data further comprises receiving mapping information corresponding to one or more allocated portions of the available storage capacity.

3. The computer-implemented method of claim 2, wherein the mapping information identifies at least one RAID stripe storing written data.

4. The computer-implemented method of claim 3, wherein the mapping information comprises a RAID stripe bitmap.

5. The computer-implemented method of claim 1, wherein reading the portion of the available storage capacity of the storage system containing the valid data further comprises:
issuing a READ VERIFY small-computer systems interface ("SCSI") command to the storage system; and
receiving an acknowledgement to the READ VERIFY SCSI command from the storage system.

6. The computer-implemented method of claim 1, wherein fixing the medium error further comprises, if the medium error exists in a parity chunk of a RAID stripe, reading a data chunk of the RAID stripe, computing the parity chunk of the RAID stripe, and writing the parity chunk of the RAID stripe.

7. The computer-implemented method of claim 1, wherein fixing the medium error further comprises, if the medium error exists in a data chunk of a RAID stripe, reading one or more data chunks and a parity chunk of the RAID stripe containing the medium error.

8. The computer-implemented method of claim 1, further comprising wherein dynamically controlling a rate or speed of the patrol read operations based on the I/O load on the storage system.

9. The computer-implemented method of claim 8, wherein determining an I/O load on the storage system further comprises using information lifecycle management ("ILM") statistics for the storage system.

10. A non-transitory computer-readable recording medium having computer-executable instructions stored thereon for performing efficient patrol read operations in a storage system including a plurality of disks organized in a RAID array that, when executed by a storage server computer, cause the storage server computer to:
determine an input/output ("I/O") load on the storage system;
identify at least one portion of an available storage capacity of the storage system containing valid data by querying a distributed volume management layer to request one or more allocated provisions containing valid data;
read the portion of the available storage capacity of the storage system containing the valid data;
determine whether a medium error exists in the portion of the available storage capacity of the storage system containing the valid data; and
if a medium error exists, fix the medium error, wherein reading the portion of the available storage capacity of the storage system containing the valid data, determining whether a medium error exists in the portion of the available storage capacity of the storage system containing the valid data and fixing the medium error are performed only when the I/O load on the storage system is less than a predetermined threshold.

11. The non-transitory computer-readable recording medium of claim 10, wherein identifying at least one portion of an available storage capacity of the storage system containing valid data further comprises receiving mapping information corresponding to one or more allocated portions of the available storage capacity.

12. The non-transitory computer-readable recording medium of claim 11, wherein the mapping information identifies at least one RAID stripe storing written data.

13. The non-transitory computer-readable recording medium of claim 12, wherein the mapping information comprises a RAID stripe bitmap.

14. The non-transitory computer-readable recording medium of claim 10, wherein reading the portion of the available storage capacity of the storage system containing the valid data further comprises:
issuing a READ VERIFY small-computer systems interface ("SCSI") command to the storage system; and
receiving an acknowledgement to the READ VERIFY SCSI command from the storage system.

15. The non-transitory computer-readable recording medium of claim 10, wherein fixing the medium error further comprises, if the medium error exists in a parity chunk of a RAID stripe, reading a data chunk of the RAID stripe, computing the parity chunk of the RAID stripe, and writing the parity chunk of the RAID stripe.

16. The non-transitory computer-readable recording medium of claim 10, wherein fixing the medium error further comprises, if the medium error exists in a data chunk of a RAID stripe, reading one or more data chunks and a parity chunk of the RAID stripe containing the medium error.

17. The non-transitory computer-readable recording medium of claim 10, having further computer-executable instructions stored thereon that, when executed by the storage server computer, cause the storage server computer to dynamically control a rate or speed of the patrol read operations based on the I/O load on the storage system.

18. A storage server computer for performing efficient patrol read operations in a storage system, the storage system including a plurality of disks organized in a RAID array, the storage server computer comprising:
a processing unit; and
a memory operably coupled to the processing unit, the memory having computer-executable instructions stored thereon that, when executed by the processing unit, cause the storage server computer to:
determine an input/output ("I/O") load on the storage system;
identify at least one portion of an available storage capacity of the storage system containing valid data by querying a distributed volume management layer to request one or more allocated provisions containing valid data;
read the portion of the available storage capacity of the storage system containing the valid data;

determine whether a medium error exists in the portion of the available storage capacity of the storage system containing the valid data; and if a medium error exists, fix the medium error, wherein reading the portion of the available storage capacity of the storage system containing the valid data, determining whether a medium error exists in the portion of the available storage capacity of the storage system containing the valid data and fixing the medium error are performed only when the I/O load on the storage system is less than a predetermined threshold.

19. The storage server computer of claim 18, wherein identifying at least one portion of an available storage capacity of the storage system containing valid data further comprises receiving mapping information corresponding to one or more allocated portions of the available storage capacity.

20. The storage server computer of claim 19, wherein the mapping information identifies at least one RAID stripe storing written data.

* * * * *